(12) United States Patent
Kim et al.

(10) Patent No.: US 7,868,349 B2
(45) Date of Patent: Jan. 11, 2011

(54) LIGHT SOURCE APPARATUS AND FABRICATION METHOD THEREOF

(75) Inventors: Geun-Ho Kim, Seoul (KR); Ki-Chang Song, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 653 days.

(21) Appl. No.: 11/059,525

(22) Filed: Feb. 17, 2005

(65) Prior Publication Data

US 2006/0180828 A1    Aug. 17, 2006

(51) Int. Cl.
*H01L 33/00* (2010.01)

(52) U.S. Cl. .................... 257/100; 257/98; 257/99; 257/635; 257/687; 257/E33.058; 257/E33.056; 257/E33.057; 257/E33.001

(58) Field of Classification Search ............ 257/98, 257/99, 100, 635, E21.502, E33.001, E29.022
See application file for complete search history.

(56) References Cited

U.S. PATENT DOCUMENTS

| | | | |
|---|---|---|---|
| 4,797,715 A | 1/1989 | Thillays et al. | 357/17 |
| 5,003,357 A | 3/1991 | Kim et al. | 357/17 |
| 6,614,172 B2 * | 9/2003 | Chiu et al. | 313/501 |
| 6,661,031 B2 | 12/2003 | Takaoka | 257/98 |
| 7,161,187 B2 * | 1/2007 | Suehiro et al. | 257/98 |
| 2002/0008325 A1 * | 1/2002 | Tominaga | 257/778 |
| 2004/0184270 A1 | 9/2004 | Halter | 362/296 |
| 2005/0082561 A1 * | 4/2005 | Suehiro et al. | 257/99 |
| 2005/0127485 A1 | 6/2005 | Shei et al. | 257/678 |
| 2006/0030063 A1 * | 2/2006 | Wang et al. | 438/22 |

FOREIGN PATENT DOCUMENTS

| | | |
|---|---|---|
| JP | 57-120386 | 7/1982 |
| JP | 59-27568 | 2/1984 |
| JP | 62-23163 | 1/1987 |
| JP | 2002-162626 | 6/2002 |
| KR | 10-2003-0054596 | 7/2003 |

\* cited by examiner

*Primary Examiner*—Lynne A Gurley
*Assistant Examiner*—Samuel A Gebremariam
(74) *Attorney, Agent, or Firm*—Ked & Associates LLP

(57) ABSTRACT

A light source apparatus and a fabrication method thereof can prevent light interference between light emitting devices adjacent to each other and increase the luminous efficiency by collecting light emitted from the side of the light emitting device toward the front of a metal stem by forming grooves at a sub-mounts, bonding the light emitting device to the inside of the groove by a flip chip bonding method and forming a reflective layer inside the groove.

18 Claims, 6 Drawing Sheets

LIGHT SOURCE APPARATUS AND FABRICATION METHOD THEREOF

BACKGROUND OF THE INVENTION

1. Field of the Invention

The present invention relates to a light source apparatus and a fabrication method thereof, and more particularly, to a light source apparatus and a fabrication method thereof enabling light emitted from respective light emitting devices to be collected toward the front of a metal stem without loss of light.

2. Description of the Background Art

A light emitting device which is actively being used at the moment is typically divided into a laser diode (LD) and a light emitting diode (LED).

The LD is widely used as a light source in the field of optical communication, and has lately been used as an important component in the field of optical media such as a DVD player, a laser disc (LD) player, a mini disc (MD) player, or the like as well as in the filed of a compact disc (CD) player and a compact disc rewritable (CD-RW) player.

In addition, the LED is widely used in a backlight unit (BLU), and is used as a light source apparatus which is located at a lower portion of an LC PANEL which cannot emit by itself and makes an LCD recognized by irradiating uniform plane light.

Advantageously, the LED can be operated at a relatively low voltage, generates less heat because of high energy efficiency and has a long life span.

FIG. 1 is a longitudinal sectional view showing the conventional light emitting device, and FIG. 2 is a longitudinal sectional view showing the conventional light source apparatus.

As shown in FIG. 1, the conventional light emitting device 10 is constructed in such a manner that a buffer layer 12, an n-contact layer 13, an active layer 14 and a p-contact layer 15 are sequentially deposited over a sapphire, n-GaAs or other substrate 11 by a chemical vapor deposition (CVD) method.

A current spraying layer 16 is formed on an upper surface of the p-contact layer 15. A p-electrode 17 which is electrically connected to the p-contact layer 15 and the current spraying layer 16 is formed on an upper surface of the current spraying layer 16. Next, an n-electrode 18 is formed on an upper surface of an exposed portion of the n-contact layer 13.

As shown in FIG. 2, in the conventional light source apparatus 40, the light emitting device 10 is bonded to a sub-mount 20 by a normal mounting bonding method, and the sub-mount 20 is bonded to a metal stem 30. At this time, the p-electrode 17 of the light emitting device 10 is connected to an electrode 21 of the sub-mount 20 by a wire 11 in order to apply the external power, and the electrode 21 of the sub-mount 20 is connected to an electrode 31 of the metal stem 30 by another wire 22. Since the n-electrode 18 has the same connection structure as the p-electrode, reference numerals concerning the connection structure of the n-electrode 18 and a description therefor will be omitted hereinafter.

An operation of the conventional light source apparatus having such a construction will be described as follows.

As shown in FIGS. 1 and 2, when a voltage is applied to the electrode 31 of the metal stem 30, the voltage is applied to the p-electrode 17 and the n-electrode 18 through wires 11 and 22.

At this time, holes and electrons are injected into the p-electrode 17 and the n-electrode 18, respectively. The injected holes and electrons are introduced into the p-contact layer 15 and the n-contact layer 13 and then are recombined in the active layer 14. At this time, extra energy is changed into light, which is emitted.

However, in case of the conventional light source apparatus, light interference between the light emitting devices adjacent to each other occurs, and light emitted from the side of the light emitting device is not collected toward the front of the metal stem but disperses, thereby decreasing the luminous efficiency.

In addition, as for a connection between the light emitting device and the sub-mount and a connection between the sub-mount and the metal stem, a connection job is very difficult because the normal mounting bonding method using wires is used and thus yield is decreased.

SUMMARY OF THE INVENTION

Therefore, an object of the present invention is to provide a light source apparatus and a fabrication method thereof capable of preventing light interference between light emitting devices adjacent to each other and increasing the luminous efficiency by collecting light emitted from the side of the light emitting device toward the front of the metal stem.

To achieve these and other advantages and in accordance with the purpose of the present invention, as embodied and broadly described herein, there is provided a light source apparatus, comprising: a metal stem; a sub-mount having one surface deposited over the metal stem and the other surface having a groove, wherein an electrode layer and a solder layer are sequentially deposited over the groove; and a light emitting device bonded to the solder layer of the sub-mount.

An electrode of the light emitting device is directly connected with the electrode layer of the sub-mount, and the electrode layer of the sub-mount is connected with the electrode layer of the metal stem by a wire.

Preferably, the depth of the groove is formed to be relatively greater than the height of the light emitting device.

The metal stem is an MC PCB, and the light emitting device is an LED.

To achieve these and other advantages and in accordance with the purpose of the present invention, as embodied and broadly described herein, there is provided a fabrication method of a light source apparatus, comprising: forming a plurality of grooves on a silicon substrate at regular intervals; forming an electrode layer and a solder layer sequentially over a front surface of the silicon substrate having the grooves; forming a plurality of sub-mounts by cutting off the silicon substrate equally by units of groove; bonding the light emitting device to the solder layer of the sub-mount such that an electrode of the light emitting device can be connected to the electrode layer of the sub-mount; and completing the light source apparatus by aligning the sub-mount with the metal stem.

Preferably, a reflective layer and an insulating layer are sequentially formed on a front surface of the silicon substrate after the step of forming grooves on a front surface of the silicon substrate.

Preferably, a flip chip bonding method is used in the step of bonding the light emitting device to the solder layer of the sub-mount.

Preferably, the electrode layer of the sub-mount is connected with an electrode of the metal stem by a normal mounting method.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, a light source apparatus and a fabrication method thereof in accordance with the present invention will be described with reference to the accompanying drawings.

Figure 1:
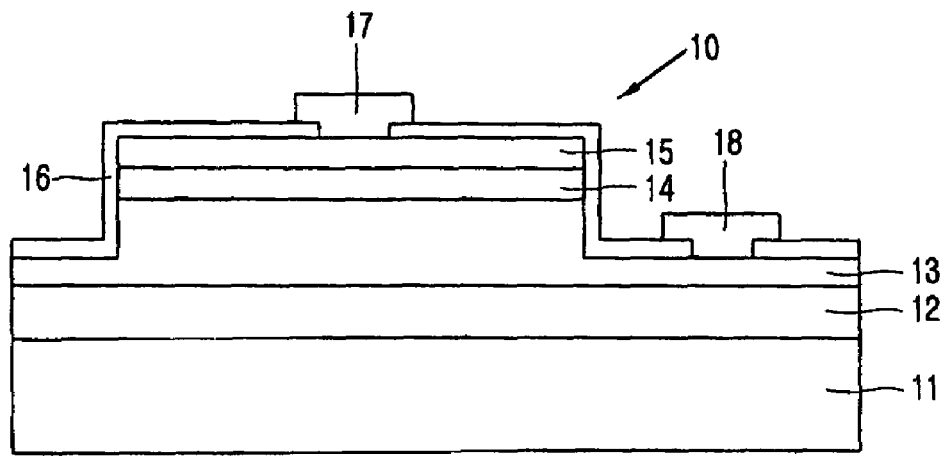
FIG. 1 is a longitudinal sectional view showing the conventional light emitting device.
Figure 2:
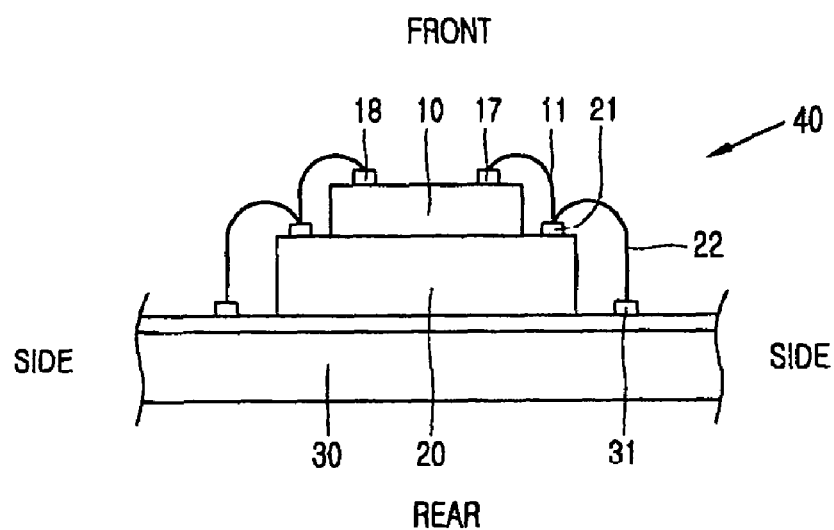
FIG. 2 is a longitudinal sectional view showing the conventional light source apparatus.
Figure 3:
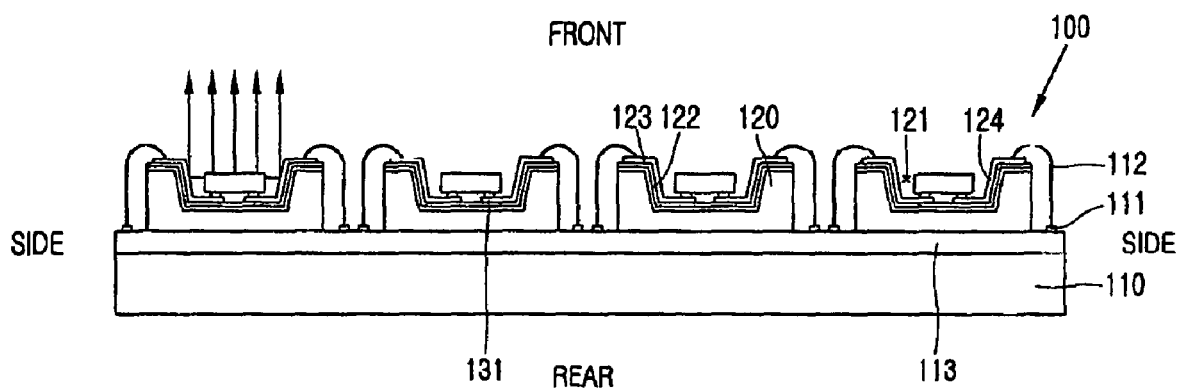
FIG. 3 is a longitudinal sectional view showing a light source apparatus in accordance with the present invention.
Figure 4:
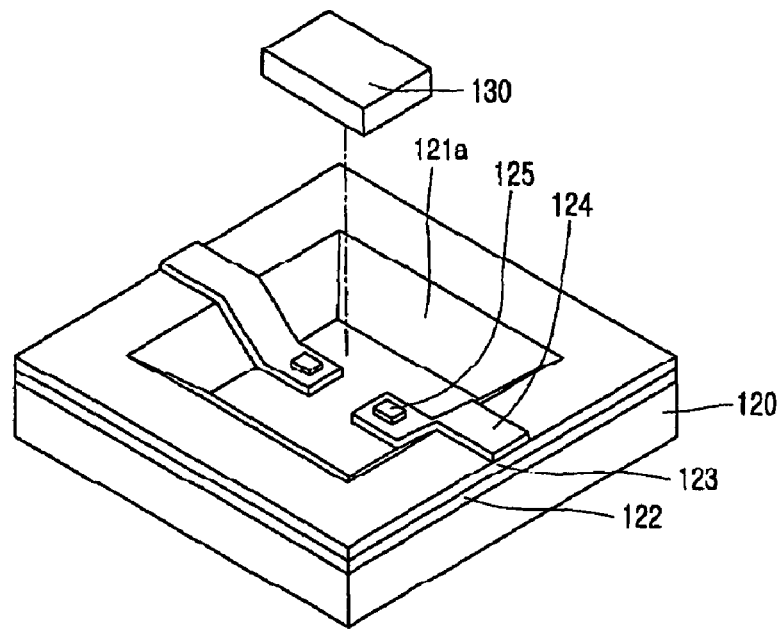
FIG. 4 is an exploded perspective view showing a sub-mount and a light emitting device in the light source apparatus in accordance with the present invention.
Figure 5:
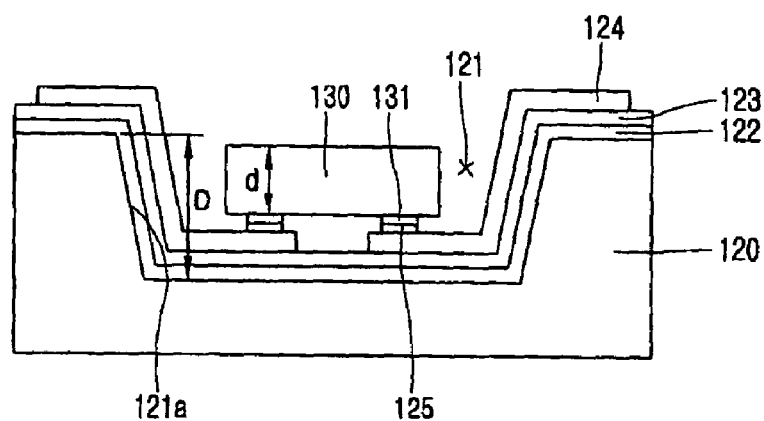
FIG. 5 is a longitudinal sectional view showing the sub-mount and the light emitting device in the light source apparatus in accordance with the present invention.

FIG. 3 is a longitudinal sectional view showing a light source apparatus in accordance with the present invention, FIG. 4 is an exploded perspective view showing a sub-mount and a light emitting device in the light source apparatus in accordance with the present invention, and FIG. 5 is a longitudinal sectional view showing the sub-mount and the light emitting device in the light source apparatus in accordance with the present invention.

As shown in FIGS. 3 to 5, a light source apparatus 100 in accordance with the present invention includes: a metal stem 110; a sub-mount 120 having one surface deposited over the metal stem 110 and the other surface on which a groove 121 is formed, wherein a reflective layer 122, an insulating layer 123, an electrode layer 124 and a solder layer 125 are sequentially deposited over the groove 121; and a light emitting device 130 bonded to the solder layer 125 of the sub-mount 120.

In the light source device 100, by forming the groove 121 at one surface so as to mount the light emitting device 130 thereon, light emitted from the light emitting device 130 does not disperse but is sent to the front side of the metal stem 110, thereby increasing the luminous efficiency. Here, thickness of the sub-mount 120 is reduced by means of the groove 121, thereby facilitating heat generation of the light emitting device 130.

In addition, by forming the reflective layer 122 on the sub-mount 120, light emitted from the front and side surfaces of the light emitting device 130 is effectively collected toward the front of the metal stem 110. Here, the reflective layer 122 is formed by using a deposition method or a lift-off method, and is preferably made of materials such as Ag or Al having a high reflection coefficient.

The insulating layer 123 is formed on an upper surface of the reflective layer 122 in order that the reflective layer 122 does not come in contact with the electrode layer 124.

Any materials having insulating properties are allowable as materials of the insulating layer 123, but one from AlN, ZnO, BeO, $SIO_2$ and SiNx is preferably used by a sputtering method or a vapor deposition method. In addition, the insulating layer used in a semiconductor process such as a silicon nitride layer can be used.

One of materials which can be bonded with the melting point of less than 400° C., for example, Au—Sn, In, Pb, Pb—Sn or Ag—Sn is preferably used as the solder layer.

For the reference, in a method for bonding two electrodes, a method for bonding two electrodes by making the two electrodes face each other is called a flip chip bonding method, and a method for connecting the two electrodes by wires is called a normal mounting bonding method. Substantially, electrodes of the light emitting device 130 are divided in to an n-electrode and a p-electrode. However, since the n-electrode and the p-electrode have symmetric connection structures, both the n-electrode and the p-electrode are marked as an electrode 131 for the purpose of simplicity in the present invention.

In case of the light source apparatus 100 in accordance with the present invention, the electrode 131 of the light emitting device 130 is bonded directly to one end of the electrode layer 125 of the sub-mount 120 by the flip chip bonding method, and the other end of the electrode layer 125 of the sub-mount 120 is connected to the electrode layer 111 of the metal stem 110 by the wire 112 by the normal mounting bonding method.

Preferably, the depth (D) of the groove 121 is formed to be relatively greater than the height (d) of the light emitting device 130.

That is, only if the depth (D) of the groove 121 is formed to be relatively greater than the height (d) of the light emitting device 130, light emitted from the side of the light emitting device 130 does not disperse but reflects from the reflective layer 122 and therefore can be collected toward the front of the metal stem 110.

An incline 121a is formed at the groove 121 in order that light emitted from the side of the light emitting device 130 can be collected toward the front of the metal stem 110, and the reflective layer 122 is deposited along the incline 121a.

In addition, the light emitting device 130 is typically divided into a laser diode (LD) and a light emitting diode (LED). In FIGS. 3 to 5, the light emitting device 130 is the light emitting diode (LED).

The insulating layer 113 is deposited over the metal stem 110 and the sub-mount 120 is bonded to the insulating layer 113, whereby the insulating layer 113 insulates the metal stem 110 and the sub-mount 120.

The metal stem 110 is preferably formed of an MC PCB (Metal Core Printed Circuit Board) having superior heat release properties. The MC PCB quickly absorbs heat generated from the light emitting device 130 and emits the heat, thereby making the light emitting device 130 emit light smoothly and extending the life span of the light emitting device 130.

An operation of the light source apparatus having such a construction in accordance with the present invention will be described as follows.

As shown in FIGS. 3 to 5, when a voltage is applied to the electrode 111 of the metal stem 110, the voltage is applied to the electrode 131 of the light emitting device 130 by the wire 112 and the electrode layer 124.

At this time, holes and electrons injected through the electrode 131 are recombined in an active layer (not shown) of the light emitting device 130. At this time, extra energy is changed into light, which is emitted.

At this time, since the light emitting device 130 is mounted inside the groove 121, light interference between the light emitting devices 130 adjacent to each other can be efficiently prevented.

In addition, the luminous efficiency can be increased because light emitted from the side as well as the front of the light emitting device 130 does not diffuse but is collected toward the front of the metal stem 110 by means of the reflective layer 122.

Meanwhile, FIGS. 6 to 14 are flowcharts illustrating a fabrication method of the light source apparatus in accordance with the present invention.

As shown in FIGS. 6 to 14, a fabrication method of the light source apparatus in accordance with the present invention comprises: forming a plurality of grooves 121 at regular intervals on the silicon substrate 120; sequentially forming the electrode layer 124 and the solder layer 125 over a front surface of the silicon substrate 120 at which the grooves are formed 121; forming a plurality of sub-mounts 120 by cutting off the silicon substrate 120 equally by units of groove 121; bonding the light emitting device 130 to the solder layer 125 of the sub-mount 120 such that the electrode 131 of the light emitting device 130 can be connected to the electrode layer 124 of the sub-mount 120; and completing the light source apparatus 100 by aligning the sub-mount 120 with the metal stem 110.

Figure 6:
FIGS. 6 to 14 are flowcharts illustrating a fabrication method of the light source apparatus in accordance with the present invention.
Figure 7:
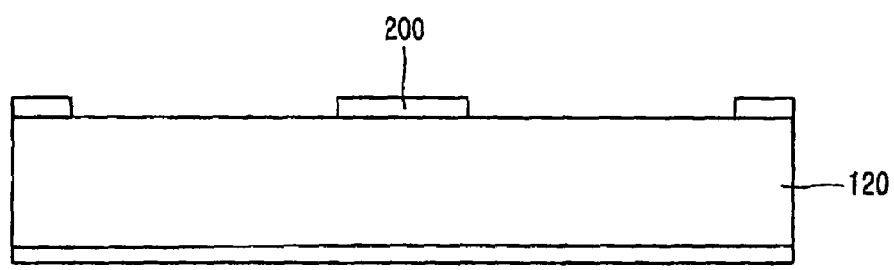
Figure 8:
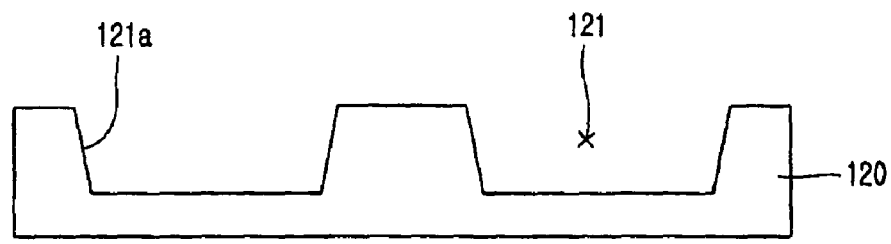

More in detail, as shown in FIGS. 6 to 8, after a plurality of grooves 121 are formed on a front surface of the silicon substrate 120, the basic material, at regular intervals by using an etching mask 200, the etching mask 200 is removed. At this time, an incline 121a is formed at the side of the groove 121.

Figure 9:
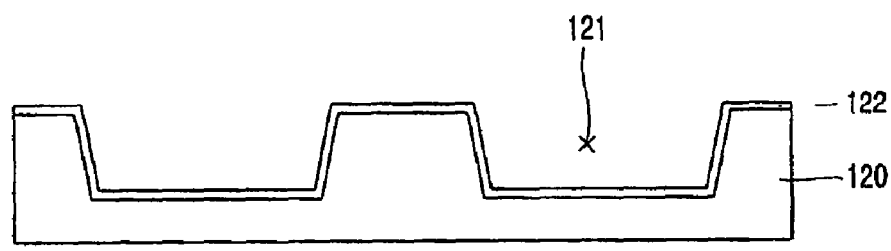
Figure 10:
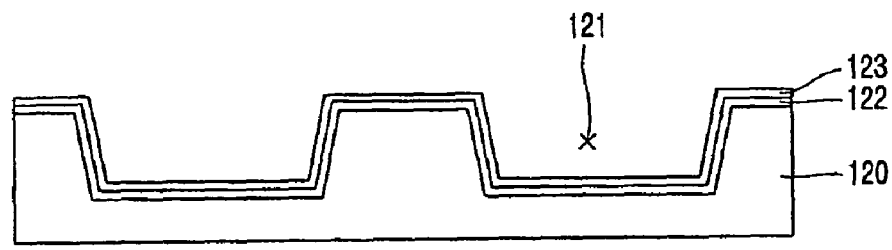
Figure 11:
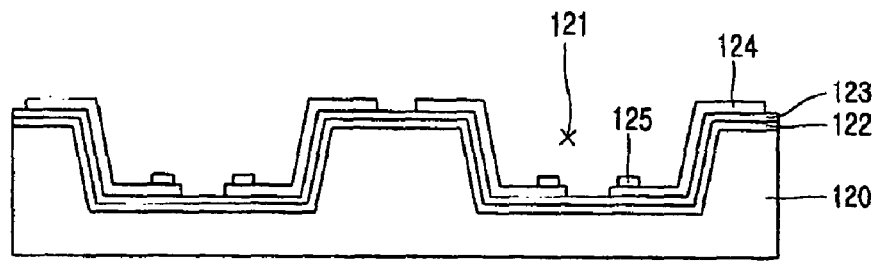

Next, as shown in FIGS. 9 to 11, the reflective layer 122, the insulating layer 123, the electrode layer 124 and the solder layer 125 are sequentially deposited over a front surface of the silicon substrate 120 on which the grooves 121 are formed. At this time, the electrode layer 124 and the solder layer 125 are preferably formed on part of the insulating layer 123.

Here, the reflective layer 122 is formed by a bonding method or a lift-off method, and is preferably made of materials such as Ag or Al having a high reflection coefficient.

The insulating layer 123 is formed on an upper surface of the reflective layer 122 such that the reflective layer 122 does not come in contact with the electrode layer 124.

AlN, ZnO or BeO having a high heat transfer coefficient is preferably used as materials of the insulating layer 123 by a sputtering method or a vapor deposition method. In addition, an insulating layer used in a semiconductor process such as a silicon nitride layer can be used.

Moreover, the electrode layer 124 is formed on an upper portion of the insulating layer 123 by using a metal etching method or a lift-off method.

Preferably, Au—Sn, In, Pb, Pb—Sn or the like is used as the solder layer 125 so as to insure an electrical connection between the electrode 131 of the light emitting layer 130 and the electrode layer 124.

Figure 12:
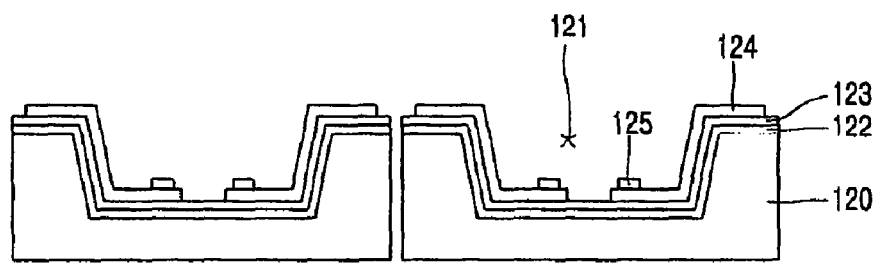

Next, as shown in FIG. 12, a plurality of sub-mounts 120 are made in the form of a chip by cutting off the silicon substrate 120 equally by units of groove 121.

Figure 13:
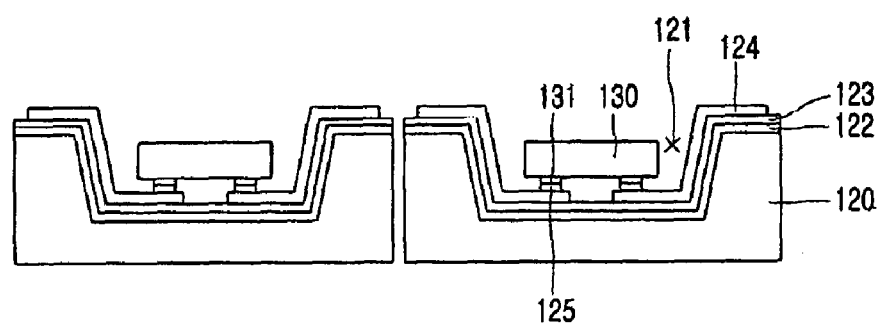

Next, as shown in FIG. 13, the light emitting device 130 is bonded to the solder layer 125 of the sub-mount 120 by using a flip chip bonding method such that the electrode 131 of the light emitting device 130 is connected with the electrode layer 124 of the sub-mount 120.

Figure 14:
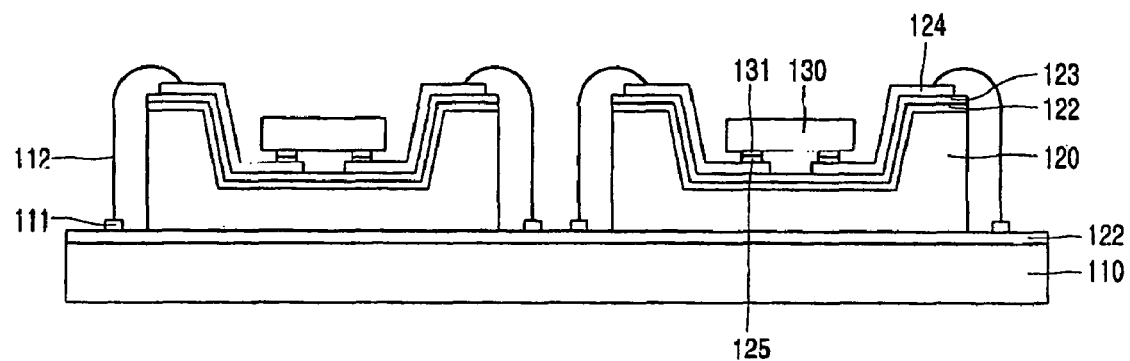

Next, as shown in FIG. 14, after the sub-mount 120 is aligned with the metal stem 110, the electrode layer 124 of the sub-mount 120 is connected with the electrode 111 of the metal stem 110 by a normal mounting bonding method, thereby completing the light source apparatus 100.

The completed light source apparatus 100 can be efficiently used in a backlight unit and a camera flash unit.

The fabrication method of the light source apparatus in accordance with the present invention can increase the luminous efficiency when the light source apparatus is applied to the backlight unit, because the incline 121a is formed on the side of the groove 121 and light emitted from the side of the light emitting device 130 is collected toward the front of the metal stem 110 by means of the reflective layer 122 formed along the incline 121a.

As described so far, according to the present invention, by forming grooves on the front surfaces of sub-mounts and mounting light emitting devices inside the grooves, light interference between the light emitting devices adjacent to each other can be prevented.

In addition, by forming a reflective layer at an inner circumferential surface of the groove, light emitted from the side of the light emitting device can be collected toward the front of the metal stem to thereby increase the luminous efficiency.

Moreover, when the light emitting device is bonded to the solder layer of the sub-mount, the light emitting device is bonded by using a flip chip bonding method, thereby improving the work of the assembly and increasing yield.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A light source apparatus, comprising:
a metal stem;
a sub-mount having one surface formed over the metal stem and the other surface having a groove, wherein a reflective layer, a first insulating layer, a first electrode layer, a second electrode layer, a first solder layer, and a second solder layer are formed over the sub-mount; and
a light emitting device attached to the first solder layer and the second solder layer of the sub-mount, wherein the reflective layer is formed on the sub-mount on an entirety of the groove, the first insulating layer is formed on an entirety of the reflective layer, and the first electrode layer and the second electrode layer are formed at specific intervals on the first insulating layer, and wherein the first solder layer is formed on the first electrode layer and the second solder layer is formed on the second electrode layer.

2. The apparatus of claim 1, wherein electrodes of the light emitting device are directly connected with the first electrode layer and the second electrode layer of the sub-mount and the first electrode layer and the second electrode layer of the sub-mount are connected with an electrode layer of the metal stem by a wire.

3. The apparatus of claim 1, wherein a depth of the groove is formed to be relatively greater than a height of the light emitting device.

4. The apparatus of claim 1, wherein the metal stem is an MC PCB.

5. The apparatus of claim 1, wherein the light emitting device is an LED.

6. The apparatus of claim 1, wherein a second insulating layer is formed over the metal stem and the sub-mount is formed over the second insulating layer.

7. The apparatus of claim 1, wherein an incline is formed at a side of the groove such that light emitted from a side of the light emitting device can be collected toward a front of the metal stem.

8. The apparatus of claim 6, wherein the first insulating layer and the second insulating layer are formed of one of AlN, ZnO, BeO, $SiO_2$ and SiNx.

9. The apparatus of claim 1, wherein the first solder layer and the second solder layer are made of a material which can be bonded with a melting point of less than 400° C.

10. The apparatus of claim 9, wherein the first solder layer and the second solder layer are formed of one of Au—Sn, In, Pb, Pb—Sn and Ag—Sn.

11. A light source apparatus, comprising:
a metal stem;
a plurality of sub-mounts formed at a front surface of the metal stem, each sub-mount having a recess having a bottom surface and a plurality of side surfaces;
a light emitting device configured to be located in the recess of the sub-mount and to be electrically connected with electrodes of the metal stem, wherein the recess has a depth that is greater than a height of the light emitting device;
a reflective layer covering an entirety of the bottom surface and all of the plurality of side surfaces of the recess to reflect light from the light emitting device towards a front of the light emitting device;
an electrode layer formed on a front surface of the sub-mount such that a first electrode and a second electrode are configured to oppose or be in proximity with each other, each electrode extending into the recess to cover a portion of at least one side surface of the plurality of side surfaces and a portion of the bottom surface of the recess; and
an insulating layer located between the reflective layer and the electrode layer to provide insulation therebetween, the insulator covering an entire surface of the reflective layer.

12. The apparatus of claim 11, wherein the recess has a trapezoidal shape formed by the bottom surface and the plurality of side surfaces.

13. The apparatus of claim 12, wherein the light emitting device has electrodes that are respectively connected with the first and second electrodes of the electrode layer to provide an electrical connection between the light emitting device and electrodes of the metal stem.

14. The apparatus of claim 13, wherein the metal stem, the sub-mounts and the light emitting device are part of an optical disc player.

15. The apparatus of claim 14, wherein the metal stem, the sub-mounts, and the light emitting device are part of a backlight device or a camera flash device.

16. A light source apparatus, comprising:
a metal layer;
a plurality of sub-mounts disposed above the metal layer, each sub-mount having a recess of a trapezoidal shape with a bottom surface and four side surfaces;
a light emitter in the recess of each sub-mount and electrically connected with electrodes of the metal layer, wherein the recess has a depth that is greater than a height of the light emitter and appropriate structural dimensions that are sufficient to minimize light interference between adjacent light emitters and to reduce an overall height of the light source apparatus;
a reflective layer on an entirety of all of the surfaces of the recess of each sub-mount to reflect and collect light from the respective light emitter to be directed towards a front of the respective light emitter to increase luminous efficiency; and
a pair of electrode layers on a front surface of each sub-mount, the pair of electrode layers including a first electrode layer and a second electrode layer that correspond to each other, each of the pair of electrode layers extending into the respective recess of the respective sub-mount to cover certain portions of one of the four side surfaces of the recess and certain portions of the bottom surface of the recess.

17. The apparatus of claim 16, further comprising:
an insulator between the reflective layer and the pair of electrode layers of each sub-mount configured to prevent electrical contact therebetween, wherein the insulator covers an entire surface of the reflective layer.

18. The apparatus of claim 16, wherein the metal layer, the plurality of sub-mounts, and the light emitters are part of an optical disc player, a backlight device, or a camera flash device.

* * * * *